United States Patent [19]
Adlerstein et al.

[11] Patent Number: 5,986,324
[45] Date of Patent: Nov. 16, 1999

[54] HETEROJUNCTION BIPOLAR TRANSISTOR

[75] Inventors: Michael G. Adlerstein, Wellesley; Mark P. Zaitlin, Harvard; Kamal Tabatabaie-Alavi, Sharon, all of Mass.

[73] Assignee: Raytheon Company, Lexington, Mass.

[21] Appl. No.: 08/827,851

[22] Filed: Apr. 11, 1997

[51] Int. Cl.$^6$ .......................... H01L 27/082; H01L 29/70
[52] U.S. Cl. .......................... 257/587; 257/522; 257/563
[58] Field of Search ..................................... 257/197, 276, 257/522, 523, 563, 564, 566, 587

[56] References Cited

U.S. PATENT DOCUMENTS 5,793,067  7/1996  Miura et al. ............................. 257/183

*Primary Examiner*—Valencia Martin-Wallace
*Assistant Examiner*—George C. Eckert, II
*Attorney, Agent, or Firm*—Fish & Richardson P.C.

[57] ABSTRACT

A bipolar transistor having a pair of transistor cells formed on a single crystal substrate. Each one of the cells including a collector electrode, an elongated emitter electrode and a base electrode disposed over a first surface of the substrate. The base electrode is adapted to control a flow of carriers between the collector and emitter electrodes. An emitter pad is disposed over the first surface of the substrate. A pair of conductive, air-bridge members is provided. First ends of the bridge members are connected to the emitter pad and second ends of the bridge members are connected along a length of the elongated emitter electrode. The substrate has an emitter contact disposed on a second surface of the substrate. The emitter pad and the emitter contact are electrically connected by an electrically conductive via passing through the substrate between the first and second surfaces of the substrate. The emitter pad comprises a resistive layer disposed serially between the pair of bridges and the emitter contact. The emitter pad includes: a resistive layer disposed over the first surface of the substrate and having an inner portion in electrical contact with the electrically conductive via; a dielectric layer disposed over an inner region of the resistive layer; and a pair of electrical contacts, an outer portion of each of the electrical contacts being disposed in electrical contact with outer portions of the resistive layer and inner portions of the pair of electrical contacts being electrically insulated from the resistive layer.

13 Claims, 4 Drawing Sheets

HETEROJUNCTION BIPOLAR TRANSISTOR

BACKGROUND OF THE INVENTION

This invention relates generally to heterojunction bipolar transistors (HBTs) and more particularly to high power HBTs.

As is known in the art, heterojunction bipolar transistors (HBTs) have been used in a wide range of applications. Group III-V HBTs, such as gallium arsenide (GaAs) based HBTs are particularly suitable for use in high power microwave applications, such as high power microwave amplifiers. One N type HBT includes a GaAs semi-insulating substrate having epitaxially grown thereon a sequence of overlaying III-V layers; i.e., an $N^+$ sub-collector layer, an $N^-$, collector layer, a relatively thin heavily doped $P^+$ base layer, a high bandgap N type emitter layer forming a heterojunction with the base layer, and a $N^+$ emitter contact layer, respectively. The $N^+$ emitter contact layer may be GaAs. The high bandgap N type emitter layer may be aluminum gallium arsenide (AlGaAs) or indium gallium phosphide (InGaP).

In one type of high power heterojunction bipolar transistor 6, a plurality of transistor cells 7 are electrically interconnected, as shown in FIG. 1. More particularly, each cell 7 includes a base electrode B, an emitter electrode E, and collector electrode C. The emitter electrodes, E, of the cells 7 are connected together in a grounded, or common emitter configuration, as shown schematically in FIG. 1. In order to equalize power dissipation among the emitters, ballast resistors, R, may be included between each emitter electrode and ground, as shown. The collector electrodes, C, are connected together at a collector contact CC and the base electrodes, B, are connected together at an input signal, or base contact BC, as shown in FIGS. 1 and 2. The emitter electrodes, E, are connected to a ground plane conductor, not shown, disposed on the bottom of the substrate by conductive vias CV which pass through the substrate. It is noted that base, emitter and collector electrodes are end-fed; that is the electrodes B, E and C are fed at ends E1, E2, and E3, respectively, as shown.

SUMMARY OF THE INVENTION

In accordance with one feature of the invention, a bipolar transistor is provided having a pair of transistor cells formed on a single crystal substrate. Each one of the cells including a collector electrode, an elongated emitter electrode and a base electrode. The electrodes are disposed over a first surface of the substrate. The base electrode is adapted to control a flow of carriers between the collector and emitter electrodes. An emitter pad is disposed over the first surface of the substrate. A pair of conductive members is provided. First ends of the conductive members are connected to the emitter pad and second ends of the conductive members are connected along a length of the elongated emitter electrode.

With such an arrangement, current passing through the emitter electrode is distributed uniformly along the length of the electrode thereby enabling the electrode to carry relatively large currents.

In accordance with another feature of the invention, the substrate has an emitter contact disposed on a second surface of the substrate. The emitter pad and the emitter contact are electrically connected by an electrically conductive via passing through the substrate between the first and second surfaces of the substrate.

With such arrangement, heat generated in the emitter electrode is conducted to the emitter contact through the substrate and the conductive via for dissipation by a heat sink upon which the substrate may be mounted.

In accordance with still another feature of the invention, the emitter pad comprises a resistive layer disposed serially between the pair of conductive members and the emitter contact.

In a preferred embodiment, the emitter pad includes: a resistive layer disposed over the first surface of the substrate and having an inner portion in electrical contact with the electrically conductive via; a dielectric layer disposed over an inner region of the resistive layer; and a pair of electrical contacts, an outer portion of each of the electrical contacts being disposed in electrical contact with outer portions of the resistive layer and inner portions of the pair of electrical contacts being electrically insulated from the resistive layer.

With such an arrangement, the emitter electrodes are electrically connected to the emitter contact through ballast resistors provided by the resistive layer of the emitter pad.

In accordance with another feature of the invention, a bipolar transistor is provided having a pair of transistor cells formed on a single crystal substrate. Each one of the cells includes a collector electrode, an emitter electrode and a base electrode. The electrodes are over a first surface of the substrate, The base electrode is adapted to control a flow of carriers between the collector and emitter electrodes. An emitter pad is disposed over the first surface of the substrate between the pair of transistor cells. A pair of conductive members is provided, first ends of the conductive members being connected to the emitter pad and second ends of the conductive members being connected to the elongated emitter electrode.

In accordance with another feature of the invention, a bipolar transistor is provided having a pair of transistor cells formed on a single crystal substrate. Each one of the cells includes a collector electrode, an elongated emitter electrode and a base electrode disposed over a first surface of the substrate. The base electrode is adapted to control a flow of carriers between the collector and emitter electrodes. A pair of electrical contacts is disposed over the first surface of the substrate between the pair of transistor cells. A pair of conductive members is provided. First ends of the conductive members are connected to a corresponding one of the electrical contacts and second ends of the conductive members are connected along a length of a corresponding one of the elongated emitter electrode. Each one of the conductive members is disposed over a corresponding one of the base electrodes.

In accordance with another feature of the invention, a resistive layer having an inner region is disposed in electrical contact with an electrically conductive via passing to the emitter contact disposed on an opposite surface the substrate. A dielectric layer is disposed over an inner region of the resistive layer. An outer portion of each of the electrical contacts is disposed in electrical contact with outer portions of the resistive layer and inner portions of the pair of electrical contacts are electrically insulated from the resistive layer.

BRIEF DESCRIPTION OF THE DRAWING

Other features and advantages of the invention will become more readily apparent when read together with the following detailed description taken together with the following drawings, in which.

DESCRIPTION OF THE PREFERRED EMBODIMENTS

Figure 1:
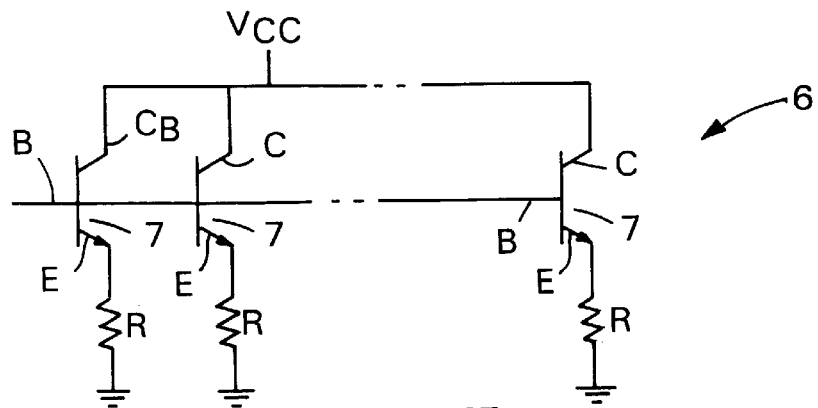
FIG. 1 is a schematic diagram of a transistor according to the PRIOR ART.
Figure 2:
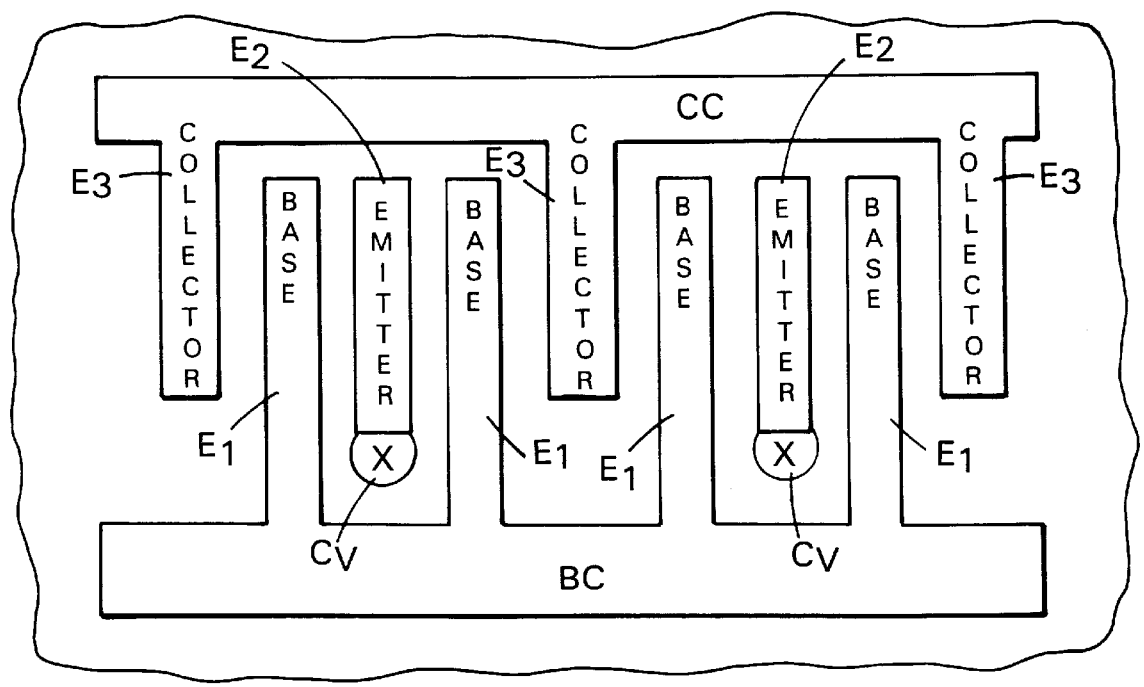
FIG. 2 is a diagrammatical sketch of a plan view of the transistor of FIG. 1, according to the PRIOR ART.
Figure 3:
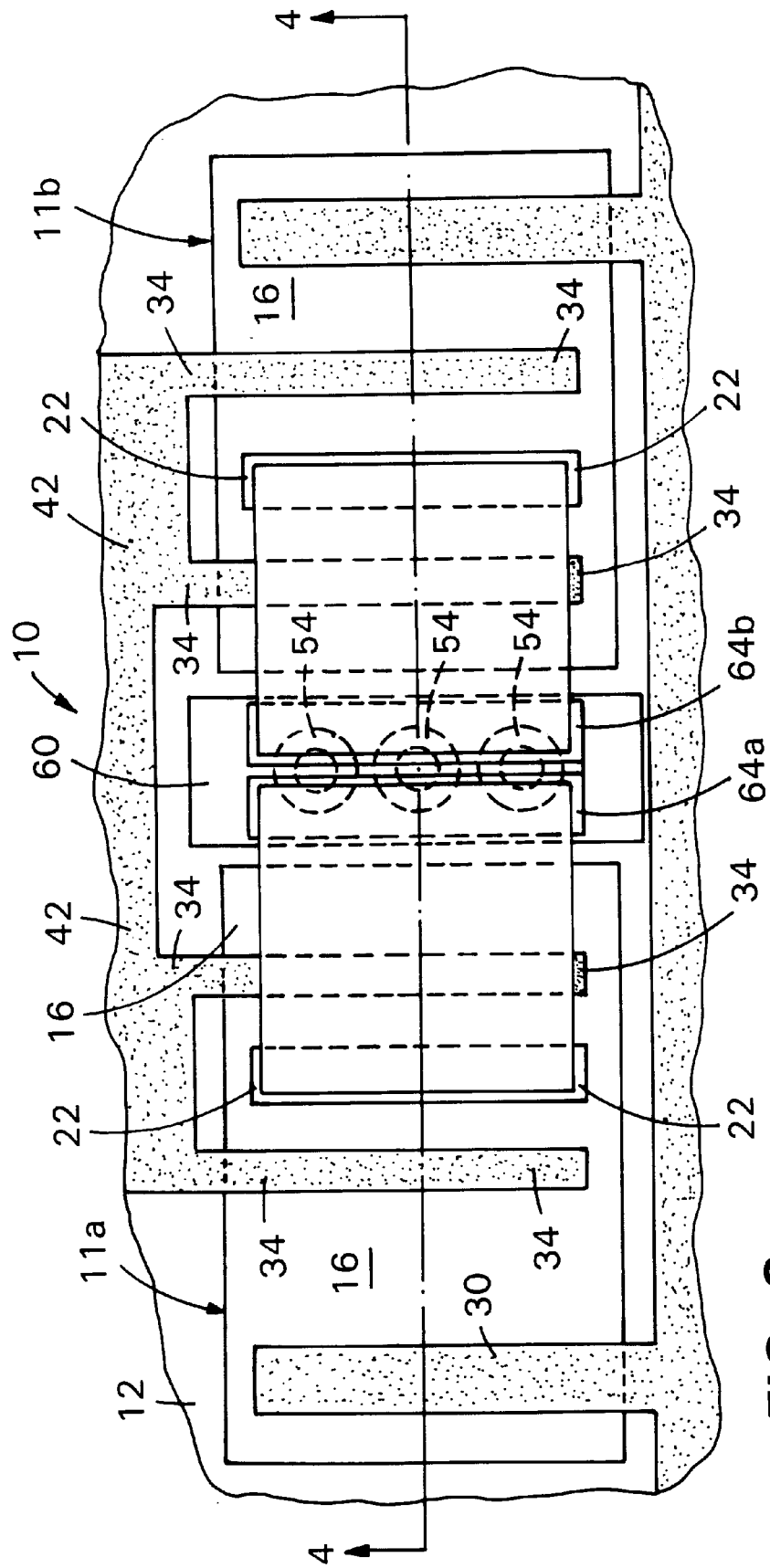
FIG. 3 is diagrammatical sketch of a plan view of a bipolar transistor according to the invention.
Figure 4:
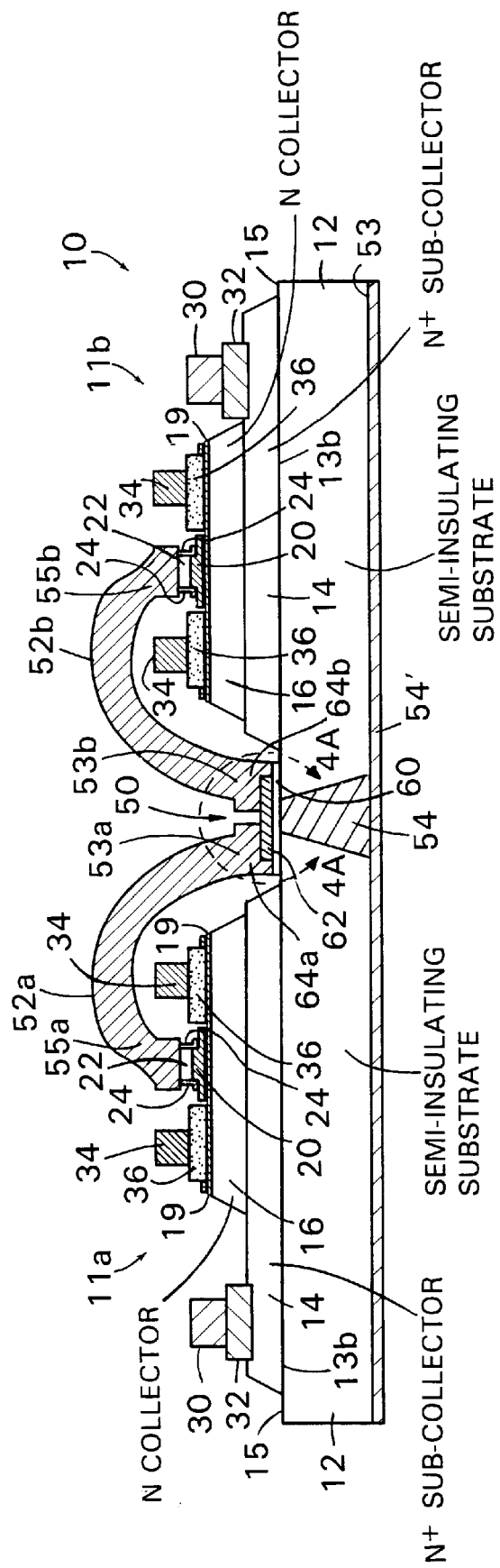
FIG. 4 is a diagrammatical cross-sectional sketch of the bipolar transistor of FIG. 3, such cross-section being taken along line 4—4 in FIG. 3.
Figure 4A:
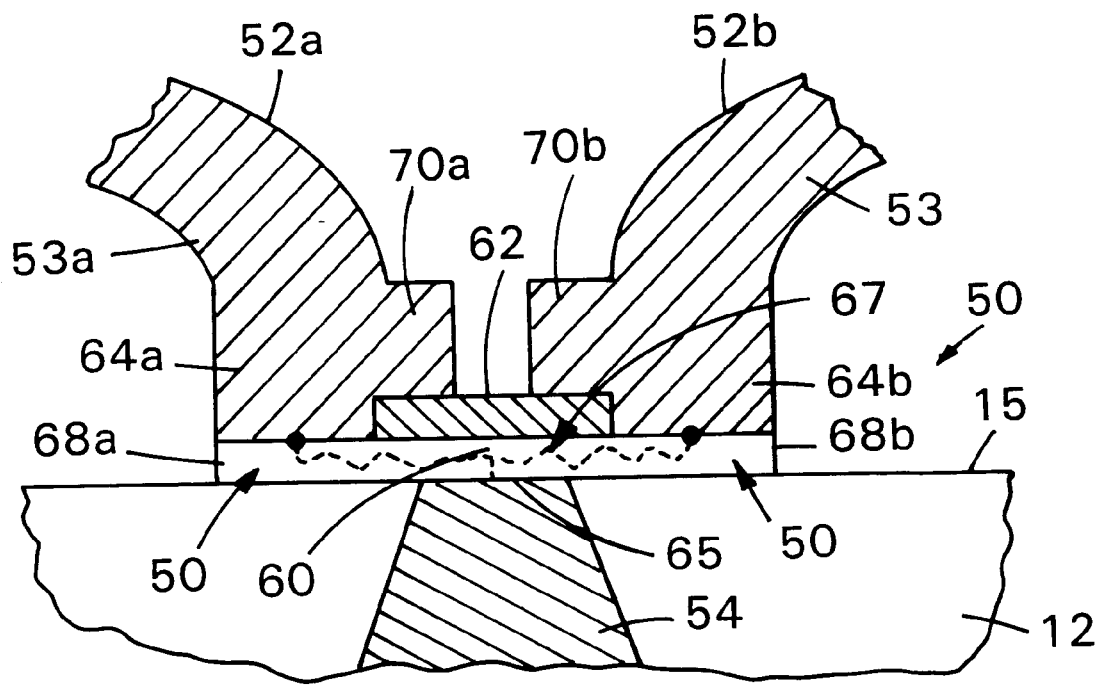
FIG. 4A is an exploded view of a portion of the transistor of FIG. 4, such portion being enclosed by an arrow 4A—4A in FIG. 4.

Referring now to FIGS. 3, 4 and 4A, a heterojunction bipolar transistor 10 is shown having a pair of electrically interconnected transistor cells 11a, 11b. The transistor 10 includes a single crystal, semi-insulating substrate 12 of III–V material, here semi-insulating gallium arsenide with the transistor cells 11a, 11b being disposed over different, laterally spaced surface regions 13a, 13b, respectively, of the substrate 12. Each one of the regions 13a, 13b, i.e. transistor cells 11a, 11b, respectively, includes a III–V sub-collector layer 14 having a relatively high first conductivity type dopant, here N+type conductivity gallium arsenide disposed over a first surface 15, here the upper surface, of the substrate gallium arsenide layer 12. A III–V collector layer 16 having the first type conductivity dopant, here N type conductivity gallium arsenide, is disposed over laterally spaced portions of the first surface 15 of the substrate 12, as shown. The N type conductivity gallium arsenide collector layer 16 is disposed on a portion of the sub-collector layer 14, as shown. A III–V, here gallium arsenide, base layer 19 having a relatively high second conductivity dopant (i.e., here P+ type conductivity) opposite to the type conductivity of the first type conductivity dopant is epitaxially grown over a surface of the collector layer 16. A III–V, here aluminum gallium arsenide or indium gallium phosphide, for example, emitter region 20 is epitaxially formed over the base region layer 19 providing a heterojunction between the III–V emitter region 20 and the base region layer 19. The emitter region 20 has N type conductivity. An emitter electrode 22 is disposed on the emitter region 20. Silicon nitride dielectric material 24 is disposed about the outer sidewalls of the emitter electrode 22 and emitter region 20, as shown.

Collector electrodes 30 are electrically connected to the sub-collector layer 14 through ohmic contact regions 32, as shown. Base electrodes 34 are electrically connected to the base layer through ohmic contact regions 36, as shown. The base electrodes 34 are adapted to control the flow of carriers between the collector electrodes 30 and the emitter electrodes 22. It is noted that the collector electrodes 30 of the pair of transistor cells 11a, 11b are electrically interconnected to a common collector contact, or contact pad, 40, as shown. Also, the base electrodes 34 are electrically interconnected to a common base contact, or base contact pad 42, as shown. It is also noted that each one of the cells 11a, 11b has a pair of base electrodes 34, one on each side of the emitter electrode 22, as shown. Also, the transistor cells 11a, 11b are mesa structures, as shown. The base and collector contact pads 42, 40, respectively are disposed on the substrate 12 and are connected to the finger-like, i.e., elongated, base and collector electrodes 34, 30, respectively, by the forming portions of electrodes 34, 30 which pass from the substrate 12 to the mesas as air-bridges.

The emitter electrodes 22 are also finger-like, (i.e., elongated) and are electrically connected to an emitter pad 50, shown more clearly in FIG. 4A, disposed between the pair of transistor cells 11a, 11b, by conductive members, here air-bridge members 52a, 52b, respectively, as shown. The emitter pad 50 is electrically connected to a ground plane conductor 54' disposed on the bottom surface of the substrate 12 by a plurality of, here three, electrically conductive vias 54 which pass through the substrate 12, as shown.

Thus, bipolar transistor 10 includes a pair of transistor cells 11a, 11b formed on a single crystal substrate 12. Each one of the cells 11a, 11b includes a collector electrode 30, an elongated emitter electrode 22 and a base electrode 34 disposed over a first surface 15 of the substrate 12. The base electrode 34 is adapted to control a flow of carriers between the collector and emitter electrodes 30, 22, respectively. An emitter pad 50 is disposed over the first surface 15 of the substrate 12 between the pair of transistor cells 11a, 11b. A pair of bridge members 52a, 52b is provided. First ends 53a, 53b, of the bridge members 52a, 52b, respectively, are connected to the emitter pad 50 and second ends 55a, 55b of the bridge members 52a, 52b, respectively are connected along a length, here along substantially the entire length, of the elongated emitter electrodes 22, as shown.

The substrate 12 has an emitter contact, i.e., the ground plane conductor 54', disposed on a second surface, i.e., the bottom surface 53 of the substrate 12. The emitter contact 54' and the emitter pad 50 are electrically connected by the electrically conductive vias 54 passing through the substrate 12 between the first and second surfaces 15, 53, of the substrate 12.

The emitter pad 50 comprises a resistive layer 60, here tantalum nitride, disposed serially between the pair of bridges 52a, 52b, and the emitter contact 54'. The resistive layer 60 provides a ballast for the transistor 10.

More particularly, the emitter pad 50 includes the resistive layer 60 disposed over the first surface 15 of the substrate 12. An inner portion 67 (FIG. 4A) of the resistive layer 60 is disposed on, and is in electrical contact with, the upper portion 65 of the electrically conductive vias 54. The emitter pad 50 also includes a dielectric layer 62 disposed over the inner region 67 of the resistive layer 60. The emitter pad 50 includes a pair of electrical contacts 64a, 64b. Each of the electrical contacts 64a, 64b is disposed in electrical contact with outer portions 68a, 68b, respectively, of the resistive layer 60, as shown more clearly in FIG. 4A. Inner portions 70a, 70b of the pair of electrical contacts 64a, 64b, respectively, are electrically insulated from the resistive layer 60 by the dielectric (i.e., insulating) layer 62, as shown. Thus, as shown more clearly in FIG. 4A, the electrical contacts 64a, 64b are connected to the conductive vias 54 by resistors, shown schematically in phantom, formed by the resistive layer 60.

It is noted that current passing through the emitter electrodes 22 is distributed uniformly along substantially the entire length of the emitter electrodes 22 thereby enabling the electrode to carry relatively large currents. Further, heat produced in the emitter electrodes 22 is thermally conducted to the ground plane conductor 54 through both the substrate 12 and the vias 54.

Figure 5:
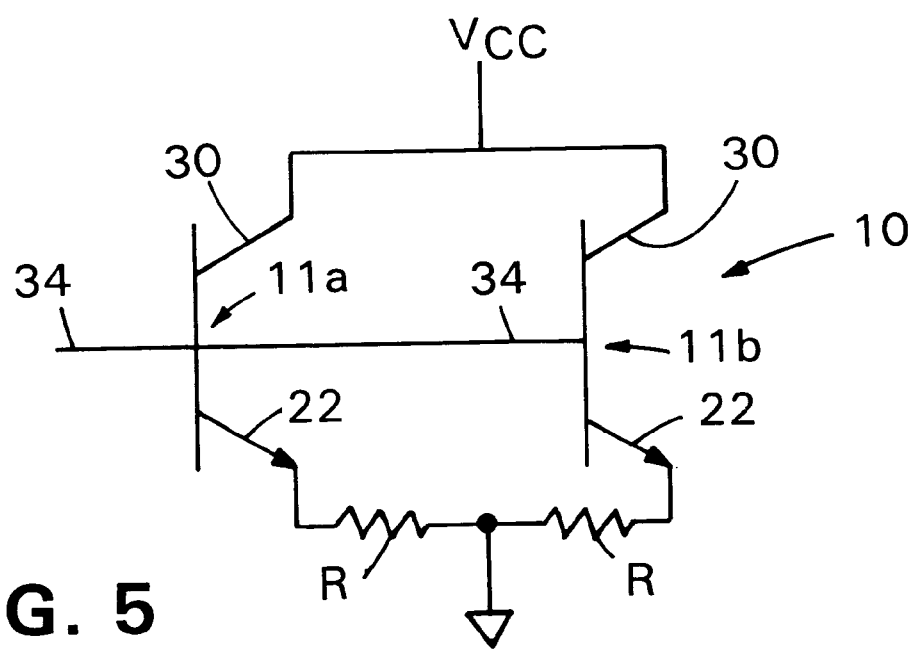
FIG. 5 is a schematic diagram of the transistor of FIG. 3.

A schematic diagram of the transistor 10 is shown in FIG. 5 with ballast resistors R provided by the resistive layer 60 being connected to the emitter electrodes 22.

Other embodiments are within the spirit and scope of the appended claims. For example, while the transistor 10 is shown to include a pair of transistor cells, such transistor may include a plurality of pairs of such cells. Further, while a gallium arsenide substrate has been described, InP substrates may be used with appropriate modification of the materials used for the collector, base and emitter regions. Still further, while only three vias 54 has been illustrated for convenience, typically up to, for example, nine vias 54 may be used for each emitter electrode.

What is claimed is:

1. A bipolar transistor comprising:

a single crystal substrate;

a pair of transistor cells formed on the substrate, each one of the cells including a collector electrode, an elongated emitter electrode and a base electrode, the electrodes being disposed over spaced apart regions, respectively, of a first surface of the substrate, the base electrode being adapted to control a flow of carriers between the collector and emitter electrodes;

an emitter pad disposed over the first surface of the substrate;

a pair of conductive members, first ends of the conductive members being connected to the emitter pad and second ends of the conductive members being connected along a length of a corresponding one of the elongated emitter electrodes.

2. The transistor recited in claim 1 wherein the substrate has an emitter contact disposed on a second surface of the substrate, and wherein the emitter pad and the emitter contact are electrically connected by an electrically conductive via passing through the substrate between the first and second surfaces of the substrate between the emitter electrodes.

3. The transistor recited in claim 1 wherein each transistor cell includes exactly one conductive member and wherein the elongated emitter electrode of each transistor cell is disposed between the emitter pad and the collector electrode of that transistor cell.

4. A bipolar transistor comprising:

a single crystal substrate;

a pair of transistor cells formed on the substrate, each one of the cells including a collector electrode, an elongated emitter electrode and a base electrode, the electrodes being disposed over spaced apart regions, respectively, of a first surface of the substrate, the base electrode being adapted to control a flow of carriers between the collector and emitter electrodes;

an emitter pad disposed over the first surface of the substrate;

a pair of conductive members, first ends of the conductive members being connected to the emitter pad and second ends of the conductive members being connected along a length of a corresponding one of the elongated emitter electrodes; and an emitter contact disposed on a second surface of the substrate between the emitter electrodes;

wherein the emitter pad and the emitter contact are electrically connected by an electrically conductive via passing through the substrate between the first and second surfaces of the substrate; and wherein the emitter pad comprises a resistive layer disposed serially between the pair of conductive members and the emitter contact.

5. A bipolar transistor comprising:

a single crystal substrate;

a pair of transistor cells formed on the substrate, each one of the cells including a collector electrode, an elongated emitter electrode and a base electrode, the electrodes being disposed over spaced apart regions, respectively, of a first surface of the substrate, the base electrode being adapted to control a flow of carriers between the collector and emitter electrodes;

an emitter pad disposed over the first surface of the substrate between the pair of transistor cells;

a pair of conductive members, first ends of the conductive members being connected to the emitter pad and second ends of the conductive members being connected along a length of a corresponding one of the elongated emitter electrodes;

wherein the substrate has an emitter contact disposed on a second surface of the substrate, and wherein the emitter pad and the emitter contact are electrically connected by an electrically conductive via passing through the substrate between the first and second surfaces of the substrate; and wherein the emitter pad comprises:

(a) a resistive layer disposed over the first surface of the substrate and having an inner portion in electrical contact with the electrically conductive via;

(b) a dielectric layer disposed over an inner region of the resistive layer; and (c) a pair of electrical contacts, an outer portion of each of the electrical contacts being disposed in electrical contact with outer portions of the resistive layer and inner portions of the pair of electrical contacts being electrically insulated from the resistive layer.

6. A bipolar transistor comprising:

a single crystal substrate;

a pair of transistor cells formed on the substrate, each one of the cells including a collector electrode, an elongated emitter electrode and a base electrode, the electrodes being disposed over spaced apart regions, respectively, of a first surface of the substrate, the base electrode being adapted to control a flow of carriers between the collector and emitter electrodes;

an emitter pad disposed over the first surface of the substrate;

a pair of conductive members, first ends of the conductive members being connected to the emitter pad and second ends of the conductive members being connected along a length of a corresponding one of the elongated emitter electrodes; and an emitter contact disposed on a second surface of the substrate between the emitter electrodes;

wherein the emitter pad and the emitter contact are electrically connected by an electrically conductive via passing through the substrate between the first and second surfaces of the substrate; and wherein the emitter pad comprises a resistive layer and wherein the conductive members are electrically connected to the electrically conductive via through portions of the resistive layer.

7. A bipolar transistor comprising:

a single crystal substrate;

a pair of transistor cells formed on the substrate, each one of the cells including a collector electrode, an elongated emitter electrode and a base electrode disposed over spaced apart regions, respectively, of a first surface of the substrate, the base electrode being adapted to control a flow of carriers between the collector and emitter electrodes;

an emitter pad disposed over the first surface of the substrate between the pair of transistor cells;

a pair of conductive members, first ends of the conductive members being connected to the emitter pad and second ends of the conductive members being connected to a corresponding one of the elongated emitter electrodes.

8. The transistor recited in claim 7 wherein the substrate has an emitter contact disposed on a second surface of the substrate, and wherein the emitter pad and the emitter contact are electrically connected by an electrically conductive via passing through the substrate between the first and second surfaces of the substrate between the emitter electrodes.

9. A bipolar transistor comprising:

a single crystal substrate;

a pair of transistor cells formed on the substrate, each one of the cells including a collector electrode, an elongated emitter electrode and a base electrode disposed over spaced apart regions, respectively, of a first surface of the substrate, the base electrode being adapted to control a flow of carriers between the collector and emitter electrodes;

an emitter pad disposed over the first surface of the substrate between the pair of transistor cells;

a pair of conductive members, first ends of the conductive members being connected to the emitter pad and second ends of the conductive members being connected to a corresponding one of the elongated emitter electrodes; and an emitter contact disposed on a second surface of the substrate;

wherein the emitter pad and the emitter contact are electrically connected by an electrically conductive via sassing through the substrate between the first and second surfaces of the substrate; and wherein the emitter pad comprises a resistive layer disposed serially between the conductive members and the emitter contact.

10. A bipolar transistor comprising:

a single crystal substrate;

a pair of transistor cells formed on the substrate, each one of the cells including a collector electrode, an elongated emitter electrode and a base electrode disposed over spaced apart regions, respectively, of a first surface of the substrate, the base electrode being adapted to control a flow of carriers between the collector and emitter electrodes;

an emitter pad disposed over the first surface of the substrate between the pair of transistor cells;

a pair of conductive members, first ends of the conductive members being connected to the emitter pad and second ends of the conductive members being connected to a corresponding one of the elongated emitter electrodes;

wherein the substrate has an emitter contact disposed on a second surface of the substrate, and wherein the emitter pad and the emitter contact are electrically connected by an electrically conductive via passing through the substrate between the first and second surfaces of the substrate;

wherein the emitter pad comprises a resistive layer disposed serially between the conductive members and the emitter contact; and wherein the emitter pad comprises:

a resistive layer having an inner region disposed in electrical contact with the electrically conductive via;

a dielectric layer disposed over an inner region of the resistive layer;

a pair of electrical contacts, an outer portion of each of the electrical contacts being disposed in electrical contact with outer portions of the resistive layer and inner portions of the pair of electrical contacts being electrically insulated from the resistive layer.

11. A bipolar transistor comprising:

a single crystal substrate;

a pair of transistor cells formed on the substrate, each one of the cells including a collector electrode, an elongated emitter electrode and a base electrode disposed over spaced apart regions, respectively, of a first surface of the substrate, the base electrode being adapted to control a flow of carriers between the collector and emitter electrodes;

a pair of electrical contacts disposed over the first surface of the substrate between the pair of transistor cells;

a pair of bridge members, first ends of the bridge members being connected to a corresponding one of the electrical contacts and second ends of the bridge members being connected along a length of a corresponding one of the elongated emitter electrodes, each one of such bridge members being disposed over a corresponding one of the base electrodes.

12. The transistor recited in claim 11 including:

a conductive via passing through the substrate between the emitter electrodes;

an emitter contact disposed on a second, opposite surface of the substrate;

wherein the via electrically connects the emitter contact to the first ends of the bridge members.

13. A bipolar transistor comprising:

a single crystal substrate;

a pair of transistor cells formed on the substrate, each one of the cells including a collector electrode, an elongated emitter electrode and a base electrode disposed over spaced apart regions, respectively, of a first surface of the substrate, the base electrode being adapted to control a flow of carriers between the collector and emitter electrodes;

a pair of electrical contacts disposed over the first surface of the substrate between the pair of transistor cells;

a pair of bridge members, first ends of the bridge members being connected to a corresponding one of the electrical contacts and second ends of the bridge members being connected along a length of a corresponding one of the elongated emitter electrodes, each one of such bridge members being disposed over a corresponding one of the base electrodes;

a conductive via passing through the substrate;

an emitter contact disposed on a second, opposite surface of the substrate;

wherein the via electrically connects the emitter contact to the bridge members;

a resistive layer having an inner region disposed in electrical contact with the electrically conductive via;

a dielectric layer disposed over an inner region of the resistive layer; and wherein an outer portion of each of the electrical contacts is disposed in electrical contact with outer portions of the resistive layer and inner portions of the pair of electrical contacts are electrically insulated from the resistive layer.

* * * * *